United States Patent
Meckel

Patent Number: 6,076,264
Date of Patent: *Jun. 20, 2000

[54] COATED MANICURE IMPLEMENT

[75] Inventor: Nathan K. Meckel, LaMesa, Calif.

[73] Assignee: Molecular Metallurgy, Inc., El Cajon, Calif.

[*] Notice: This patent is subject to a terminal disclaimer.

[21] Appl. No.: 08/909,910

[22] Filed: Aug. 12, 1997

Related U.S. Application Data

[63] Continuation-in-part of application No. 08/585,177, Jan. 11, 1996.

[51] Int. Cl.$^7$ ........................................... B26B 17/00
[52] U.S. Cl. ........................ 30/225; 30/350; 76/104.1; 76/106.5
[58] Field of Search .................. 30/346.54, 350, 30/225; 76/DIG. 8, DIG. 11, DIG. 121, 106.5, 104.1

[56] References Cited

U.S. PATENT DOCUMENTS

| | | |
|---|---|---|
| 3,988,955 | 11/1976 | Engel et al. . |
| 4,653,373 | 3/1987 | Gerber . |
| 4,933,058 | 6/1990 | Bache et al. . |
| 5,232,568 | 8/1993 | Parent et al. . |
| 5,431,071 | 7/1995 | Williams . |
| 5,528,833 | 6/1996 | Sakuma ................................. 30/350 X |
| 5,669,144 | 9/1997 | Hahn et al. ......................... 30/346.54 |

OTHER PUBLICATIONS

Herbert M. Gabriel, Vacuum Arc Discharges Used to Deposit Hard Wear Resistant Coatings onto Tools, *IEEE Trans. on Plasma Science*, vol. 21, No. 5, (Oct. 1993).

Declaration of Nathan K. Meckel and attached Press Relase of Molecular Metallurgy, Inc. dated on its face Jan. 1995.

Primary Examiner—Douglas D. Watts
Attorney, Agent, or Firm—Gregory Garmong

[57] ABSTRACT

A manicure implement is coated with a corrosion-resistant, wear-resistant material, such as zirconium nitride, titanium nitride, di-titanium nitride, and titanium carbonitride. Deposition is preferably accomplished by a cathodic arc process using linear deposition sources with simultaneous heating and rotation of a manicure implement substrate relative to the deposition sources.

18 Claims, 5 Drawing Sheets

6,076,264

1

COATED MANICURE IMPLEMENT

This application is a continuation-in-part of copending application Ser. No. 08/585,177, filed Jan. 11, 1996, for which priority is claimed.

BACKGROUND OF THE INVENTION

This invention relates to manicure implements, and, more particularly, to such implements that are hard, highly resistant to corrosion damage, and retain a good cutting edge.

A manicure is a procedure in which the nails of a person's hand are cleaned, shaped, and polished. The adjacent cuticle region of the skin may also be treated. Similar procedures (usually termed a pedicure) are also used for the nails of the feet. As used herein, the term "manicure" is to be broadly interpreted to include treatments associated both with the nails of the hands and with the nails of the feet. The manicure procedures improve the health and the appearance of the nails. The manicure may be self-administered or may be performed by a professional manicurist.

Various types of implements are used in performing the manicure. These implements include nippers of various types (including trimmers and scissors), pushers, curettes, rasps, and files. The implements should be functional and durable. Those implements that are intended to perform a cutting function, such as the nippers, trimmers, scissors, and some edges of the curettes, must receive and thereafter retain a cutting edge after extensive use. At the present, the implements are typically made of a quality stainless steel such as type 420 stainless steel.

Additionally, the manicure implements used by the professional manicurist must be corrosion resistant to disinfectants. State laws require that the manicure implements be disinfected after being used in a procedure for one person and prior to their use for a procedure with another person. The conventional disinfecting practice is to immerse the manicure implement into a liquid disinfectant compound or solution for a prescribed period of time.

In the past, phenolic compounds have typically been used as the disinfectant. Phenolic compounds are effective to kill a number of common disease-transmitting agents that may be found on a person's hands or feet. Stainless steel manicure implements may be immersed in phenolic compounds for extended periods of time without any discernable damage to the implements. However, the phenolic compounds may not kill certain other disease-transmitting agents.

More recently, heightened concern with transmission of diseases has led to the consideration and adoption of other disinfectants as well as the phenolics. For example, quaternary ammonium compounds, sometimes termed QUATs in the art, are gaining favor and being adopted by some states as required disinfectants. The QUATs are more successful in killing some disease-transmitting agents than are the phenolics.

On the other hand, the QUATs also attack and corrode the metal of the manicure implements more aggressively than do the previously used disinfectants. Even manicure implements made of high-quality stainless steels are corroded by immersion in the QUATs in only a relatively short time.

There is a need for an improved approach to the structure of manicure implements. The present invention fulfills that need, and further provides related advantages.

SUMMARY OF THE INVENTION

The present invention provides a manicure implement that is functional, durable, hard and wear resistant, and highly resistant to corrosion in a wide range of disinfectants, and a method for making the manicure implement. If the manicure implement has a sharpened edge, the edge is retained during repeated use. The shape of the manicure implement is not altered, and therefore both existing conventional and future manicure implements benefit from the use of the invention. Additionally, the manicure implement has a highly attractive color both initially and after extensive use.

In accordance with the invention, a manicure implement comprises a manicure implement substrate made of a substrate material having a surface, and a corrosion-resistant coating overlying and contacting at least a portion of the surface of the manicure implement substrate. The corrosion-resistant coating comprises a metal or ceramic coating material. Preferably, the coating material comprises a chemical combination of a metal selected from the group consisting of vanadium, chromium, zirconium, niobium, molybdenum, hafnium, tantalum, and tungsten, and combinations thereof, and a nonmetal selected from the group consisting of nitrogen and carbon and combinations thereof. The most preferred coating materials are zirconium nitride (abbreviated herein as ZrN), titanium nitride (abbreviated herein as TiN), di-titanium nitride (abbreviated herein as $Ti_2N$), titanium aluminum nitride (abbreviated herein as (TiAl)N), titanium carbonitride (abbreviated herein as Ti(CN)), or titanium aluminum carbonitride (abbreviated herein as (TiAl)(CN)). (These abbreviations are used herein as a shorthand rather than an exact chemical label, and do not suggest that the stoichiometry of the indicated compound must be exactly as stated in the abbreviation.)

The manicure implement substrate may be of any operable type, such as a nipper, a trimmer, a scissors, a pusher, a rasp, a curette, or a file. Manicure implements developed at a later time may also benefit from the present invention. The manicure implement may or may not have a sharpened edge. The present invention improves the cutting-edge performance of those implements which have a cutting edge, and the corrosion performance of all of the implements. It is preferred that all of the implements of a set have the same coating, for aesthetic reasons.

The manicure implement substrate is preferably made of a high-quality stainless steel such as type 420 stainless steel, but other operable substrate materials such as titanium alloys may be used.

The coating is preferably applied using a cathodic arc source and a controlled atmosphere of the nonmetal. Other operable techniques may also be used.

To enhance the quality of the coating and its adherence to the substrate surface, the coating is preferably applied as two or more layers of different compositions. For example, in a preferred case wherein the top layer of the coating is zirconium nitride having a champagne color, the coating preferably has a first layer of zirconium contacting the substrate surface, a second layer of zirconium nitride overlying the first layer, a third layer of zirconium overlying the second layer, and a fourth layer of zirconium nitride overlying the third layer. This multi layer approach increases the durability of the coating and reduces the possibility of exposure of any of the underlying substrate through micropores in the coating. The total thickness of the coating is preferably from about 1½ to about 5 micrometers (microns).

The coating on the surface of the substrate is hard, wear-resistant, and corrosion-resistant, and aids in retaining a cutting edge on those implements that have a cutting edge. The coating may optionally be further improved by sealing the surface with a sealant such as polytetrafluoroethylene that resides within any micropores in the coating. Because it resides within the micropores, if any, the sealant is not contacted by any wearing medium when in service.

The present invention provides a manicure implement that is fully functional and whose dimensions are not substantially changed by the coating operation, inasmuch as the coating is preferably much less than 1/1000 of an inch thick, and typically less than 2/10,000 of an inch thick. The manicure implement substrate may therefore be fabricated to substantially its desired size, and then processed according to the present approach to apply the coating. The final product is hard and durable, corrosion resistant in disinfecting media such as phenolics, and also corrosion resistant in disinfecting media such as quaternary ammonium compounds that are otherwise highly corrosive to conventional stainless steel manicure implements. The coating has a distinctive color which is determined by the selected composition of the coating and in particular its topmost layer. The color is inherent in the coating composition, and therefore does not quickly wear away as in the case of paint-like coatings.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIGS. 1 perspective views of commonly used manicure implements, wherein FIG. 1A is a nipper; FIG. 1B is a pusher, FIG. 1C is a curette, FIG. 1D is a rasp, and FIG. 1E is a file;

FIGS. 5A–C is a series of enlarged cross sectional views of the side of the manicure implement of FIG. 1, wherein FIG. 5A shows a first embodiment, FIG. 5B shows a second embodiment, and FIG. 5C shows a third embodiment.

DETAILED DESCRIPTION OF THE INVENTION

Figure 1:
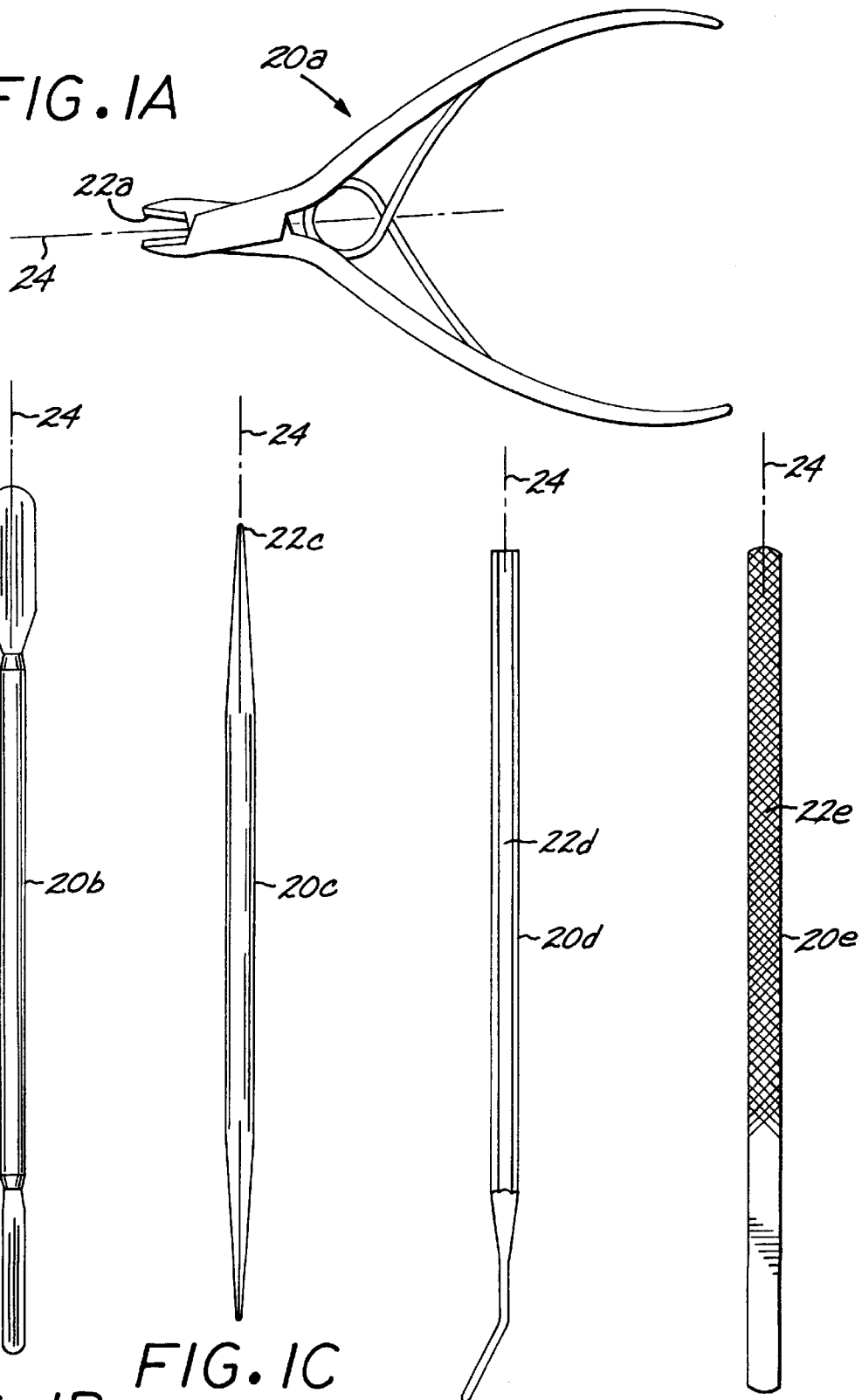

FIGS. 1A–E illustrate some commonly used manicure implements 20, any or all of which may serve as the substrates for deposition of the coatings of the invention. FIG. 1A depicts a nipper 20a (scissors and trimmers being similar in appearance); FIG. 1B depicts a pusher 20b; FIG. 1C depicts a curette 20c; FIG. 1D depicts a rasp 20d; and FIG. 1E depicts a file 20e. The nipper 20a has a cutting edge 22a; the curette 20c has an edge 22c which is used to remove skin from the cuticle and therefore should be maintained sharp; and the rasp 20d and file 20e have points with cutting edges 22d and 22e, respectively, that must be maintained sharp for proper functioning.

Implements 20 with cutting edges 22 present the most challenging deposition conditions which, to some extent, dictate the deposition approach. These problems and their solutions will be discussed subsequently. By virtue of their use in which they are held by the manicurist as tools, the manicure implements 20 typically have an implement axis 24 lying parallel to their direction of elongation. The manicure implement 20 is made of a metal, preferably a steel, most preferably a 400-series stainless steel such as 420 stainless steel, although 440, 425, or 410 stainless steels may be used as well. The manicure implement 20 is typically forged or cast to shape and then heat treated to an acceptable structure and strength. Such processing is well known in the art for each type of steel and does not form part of the present invention.

Figure 2:
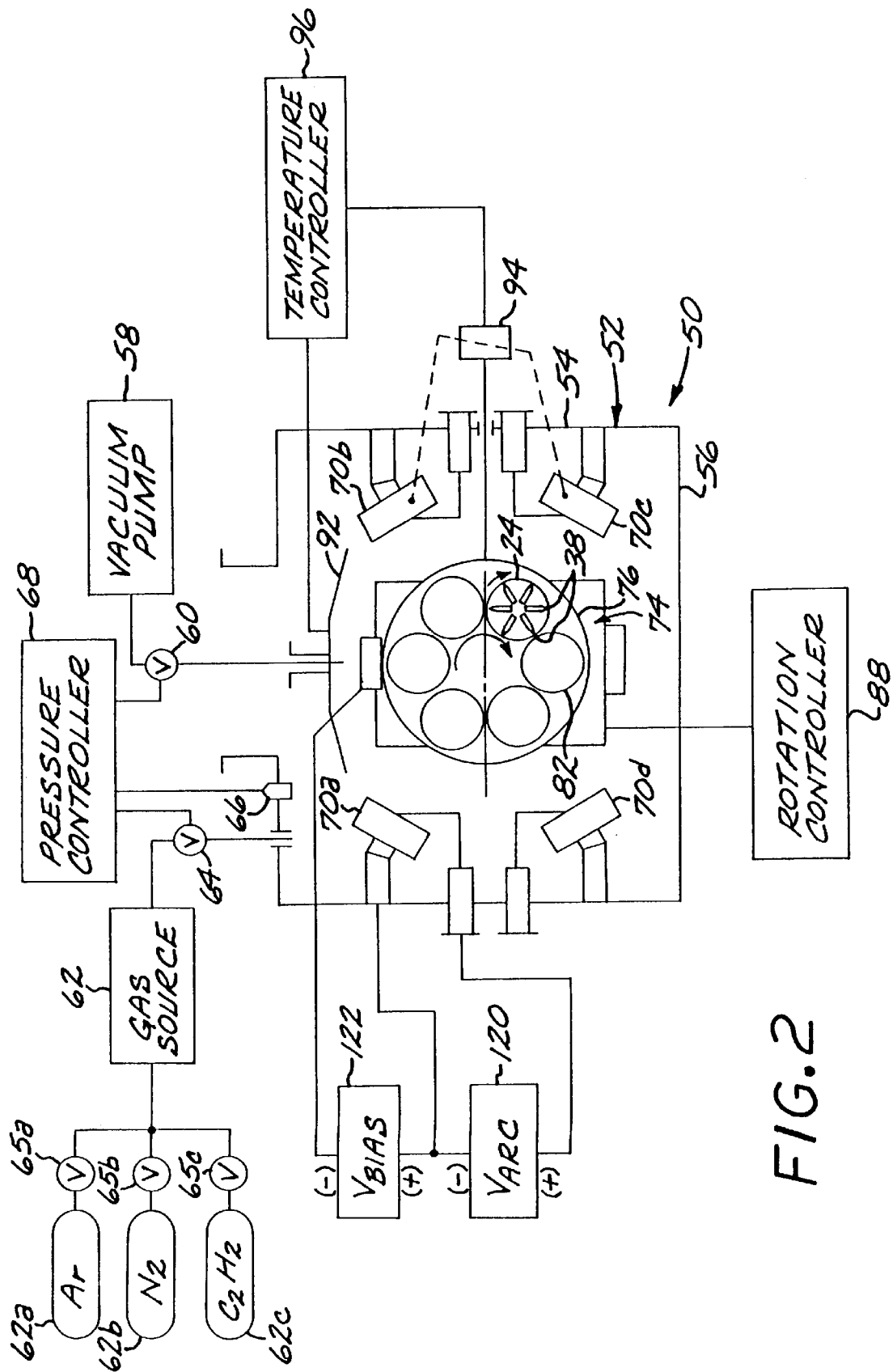
FIG. 2 is a schematic plan view and control diagram of a deposition apparatus according to the invention.
Figure 3:
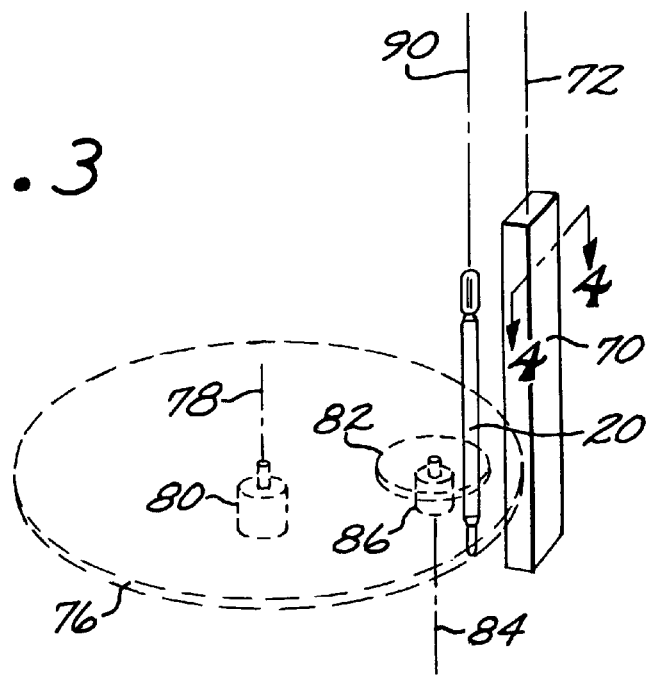
FIG. 3 is a schematic perspective view of a detail of the deposition apparatus of FIG. 2.

FIGS. 2 and 3 depict a preferred deposition apparatus 50 used to treat the manicure implement 20 by applying a coating, although other operable deposition apparatus may be used. The deposition apparatus 50 includes a chamber 52 having a body 54 and a door 56 that may be opened for access to the interior of the chamber 52 and which is hermetically sealed to the body 54 when the chamber 52 is in operation. The interior of the chamber 52 is controllably evacuated by a vacuum pump 58 pumping through a gate valve 60. The vacuum pump 58 includes a mechanical pump and a diffusion pump operating together in the usual manner. The interior of the chamber 52 may be controllably backfilled to a partial pressure of a selected gas from a gas source 62 through a backfill valve 64. The gas source 62 typically includes several separately operable gas sources. The gas source 62 usually includes a source 62a of an inert gas such as argon, a source 62b of nitrogen gas, and a source 62c of a carbon-containing gas such as acetylene, each providing gas selectively and independently through a respective selector valve 65a, 65b, or 65c. Other types of gas can also be provided as desired.

The pressure within the chamber 52 is monitored by a vacuum gage 66, whose output signal is provided to a pressure controller 68. The pressure controller 68 controls the settings of the gate valve 60 and the backfill valve 64 (and, optionally, the selector valves 65), achieving a balance of pumping and backfill gas flow that produces a desired pressure in the chamber 52 and thence pressure reading in the vacuum gage 66. Thus, the gaseous backfilled atmosphere within the chamber 52 is preferably a flowing or dynamic atmosphere.

At least two, and preferably four as shown, linear deposition sources 70 are mounted within the interior of the chamber 52 in a circumferentially spaced-apart manner. In FIG. 2, the four deposition sources are identified as distinct sources 70a, 70b, 70c, and 70d, as they will be addressed individually in the subsequent discussion. The four deposition sources 70 are generally rectangular bodies having a greatest rectilinear dimension elongated parallel to a source axis 72. This type of deposition source is distinct from either a stationary point source or a point source that moves along the length of the substrate during deposition procedures.

A substrate support 74 is positioned in the chamber 52. The substrate support 74 produces a compound rotational movement of a substrate mounted thereon. The preferred substrate support 74 includes a rotational carriage 76 that rotates about a rotational axis 78, driven by a rotational drive motor 80 below the rotational carriage 76. Mounted on the rotational carriage 76 are at least one and preferably six, as shown, planetary carriages 82. The planetary carriages 82 are rotationally driven about a rotational axis 84 by a planetary drive motor 86 below the planetary carriages 82. The speeds of the rotational drive motor 80 and the planetary drive motor 86 are controlled by a rotation controller 88.

For deposition processing, the manicure implement 20 is mounted to the planetary carriage 82 with appropriate fixturing such that the implement axis 24 is parallel to the rotational axis 84 and the cutting edge 22, if present, faces outwardly from the rotational axis 84 and center of the planetary carriage 82. That is, as the rotational carriage 76 and the planetary carriage 82 rotate, the cutting edge 22, if present, of at least one of the implements 20 on the planetary carriage 82 preferably faces approximately toward the closest deposition source 70 as it passes close to the deposition source 70. This arrangement is to be contrasted with a possible alternative approach wherein the implement 20 is intentionally oriented so that its cutting edge faces away from the deposition source 70 so as to never be in a close facing relation to the deposition sources 70. For commercial operations, multiple implements 20 are typically mounted on each planetary carriage 82 in the manner described, as illustrated for one of the planetary carriages 82 in FIG. 3.

In the deposition apparatus 50, the implement axis 24, the source axis 72, the rotational axis 78, and the rotational axis 84 are all arranged to be approximately parallel to a common axis 90.

The temperature of the implements 20 during deposition is controlled using a heater 92 that extends parallel to the deposition sources 70 on one side of the interior of the chamber 52. The heater 92 is preferably a radiant heater operating with electrical resistance elements. Experience has shown that, due to the rotational movement of the carriages 76 and 82 and the heat retention capacity of the implements 20, the single heater 92 on one side of the chamber 52 provides a sufficiently uniform heating of the substrates. The temperature of the substrate implements 20 is monitored by a temperature sensor 94 such as an infrared sensor that views the interior of the chamber. The temperature measured by the sensor 94 is provided to a temperature controller 96 that provides the power output to the heater 92. Acting in this feedback manner, the temperature controller 96 allows the temperature of the substrate implements 20 to be set. (The implements are also heated to some extent by the deposition process, so that the heater acts as the fine tuning instrument to control the temperature of the implements.) In the preferred processing of stainless steel implements 20 with an applied zirconium-containing or titanium-containing coating, the implements 20 are heated to a temperature of from about 600° F. to about 900° F.

Figure 4:
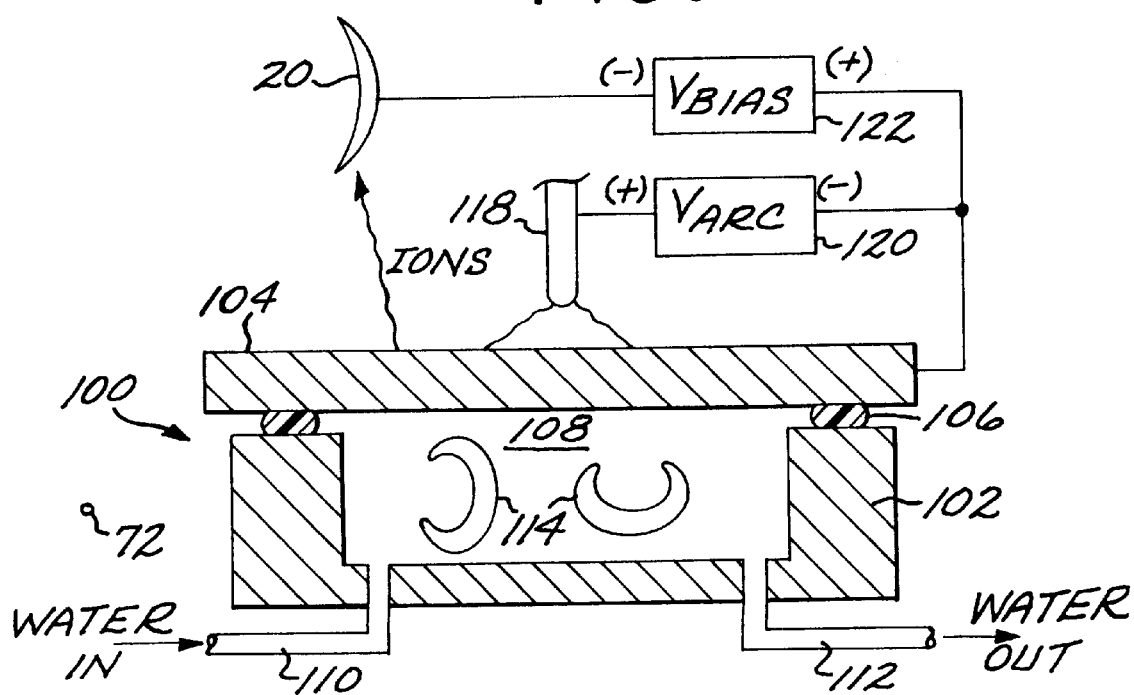
FIG. 4 is a schematic sectional view of a preferred cathodic arc source, taken along lines 4—4 of FIG. 3.

FIG. 4 illustrates a cathodic arc source 100 used in the preferred form of the deposition source 70. The cathodic arc source 100 includes a channel-shaped body 102 and a deposition target 104. The deposition target 104 is in the form of a plate that is hermetically sealed to the body 102 using an O-ring 106, forming a water-tight and gas-tight hollow interior 108. The interior 108 is cooled with cooling water flowing through a water inlet 110 and a water outlet 112. Two spirally shaped (only sections of the spirals are seen in FIG. 4) permanent magnets 114 extend parallel to the source axis 72. Positioned above the deposition target 104 exterior to the body 102 is a striker electrode 118. A voltage $V_{ARC}$ is applied between the striker electrode 118 and the deposition target 104 by an arc source power supply 120. $V_{ARC}$ is preferably from about 10 to about 50 volts.

The metallic material that initially forms the deposition target 104 is deposited onto the substrate implements 20, together with, if desired, gas atoms producing gaseous species from the atmosphere of the chamber. In the preferred embodiment, the deposition target 104 is made of zirconium (Zr), titanium (Ti) or equiatomic titanium aluminide (TiAl). Other metallic species operable as the deposition target material include metals found in Groups IV–VI of the Periodic Table, including but not limited to vanadium, chromium, niobium, molybdenum, hafnium, tantalum, and tungsten. Other metals such as aluminum may be used. The deposition target may also be made of alloys or intermetallic compounds such as, for example, Ti-6Al-4V or $Ti_3Al$.

To accomplish the deposition, an arc is struck between the striker electrode 118 and the deposition target 104, locally heating the deposition target 104 and causing aluminide atoms and/or ions to be ejected from the deposition target 104. (The deposition target 104 is therefore gradually locally thinned as the deposition proceeds.) The striking point of the arc on the deposition target 104 moves in a racetrack course along the length of the deposition target 104. A negative bias voltage $V_{BIAS}$ is applied between the deposition target 104 and the substrate manicure implement 20 by a bias power supply 122, so that any positively charged ions are accelerated toward the manicure implement 20.

$V_{BIAS}$ is preferably from about –30 to about –600 volts. The value selected for $V_{BIAS}$ determines the energy of ionic impacts against the surface of the implement, a phenomenon termed ion peening. In a typical case, $V_{BIAS}$ is initially selected to be a relatively large negative voltage to achieve good adherence of the first metallic layer (discussed subsequently) to the implement substrate. $V_{BIAS}$ is subsequently reduced (made less negative) when overlying hard layers are deposited, to achieve a uniform, fine microstructure in the layers. The values of $V_{BIAS}$ are desirably maintained as low as possible consistent with obtaining an adherent coating. $V_{BIAS}$ is more positive than –600 volts, and most preferably more positive than –400 volts. If $V_{BIAS}$ is too negative, corona effects and backsputtering occur in the region of the sharpened implement, if the implement has a cutting edge 22, dulling the implement (if already sharpened) and removing the coating already deposited onto the cutting edge. Thus, while higher $V_{BIAS}$ voltages may be used for other types of articles being coated, the geometry of implements 20 with cutting edges 22 limits the $V_{BIAS}$ values that can be used.

The cathodic arc source is preferred, but other types of sources such as sputtering sources may also be used.

The cooperative selection of the material of the deposition target 104 and the gases introduced into the deposition chamber from the gas source 62 allows a variety of coatings 130 to be deposited onto the manicure implement 20. In all cases, the total thickness of the coating 130 is preferably from about 1½ to about 5 micrometers. If the coating thickness is less than about 1½ micrometers, the physical properties of the coating are insufficient to produce the desired results. If the coating thickness is more than about 5 micrometers, the coating has a high internal stress that leads to a tendency for the coating to crack and spall away from the manicure implement 20 during deposition or during service.

Figure 5A:
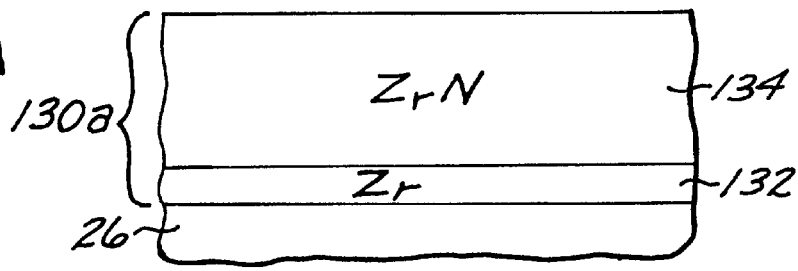
Figure 5B:
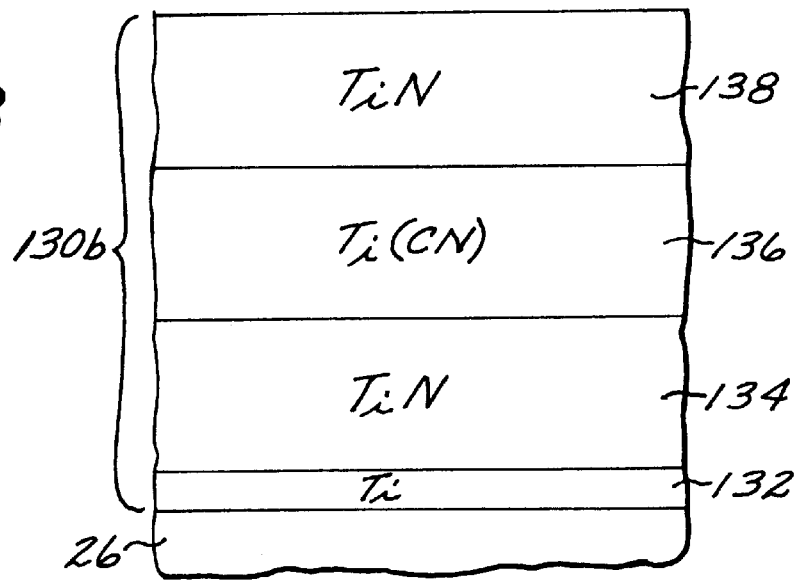
Figure 5C:
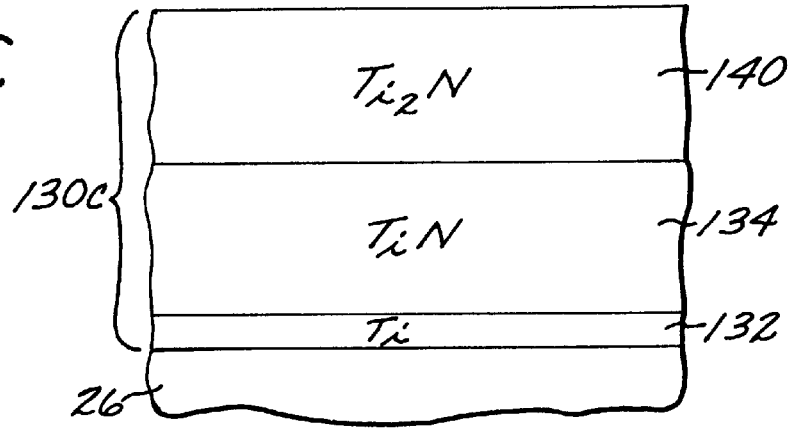

FIGS. 5A–5C depict three coating systems 130 of interest, by way of illustrating the preferred approaches and also the types of coating structures that may be produced. (These figures are not drawn to scale.) The invention is not limited to these coating systems 130, however. The coating 130a of FIG. 5A includes a first layer 132 of metallic zirconium contacting the surface of the manicure implement 20. The first metallic layer aids in adhering the overlying layer(s) to the surface of the implement substrate 20. The first layer 132 is preferably quite thin, on the order of from about 100 Angstroms to about 1000 Angstroms thick. The first layer 132 is deposited by backfilling the deposition chamber with a small partial pressure of about 5 microns of an inert gas such as flowing argon (flowing at a rate of about 200–450 standard cubic centimeters per minute (sccm) in the apparatus used by the inventors), and then depositing zirconium from the deposition target 104 with $V_{BIAS}$ about −400 volts. Because the argon does not chemically react with the zirconium, the first layer 132 is metallic zirconium. A second layer 134 overlies the first layer 132. The second layer 134 is zirconium nitride (ZrN), which is deposited by backfilling the deposition chamber with a small partial pressure of about 5 microns of flowing nitrogen (flowing at a rate of about 150–500 sccm in the inventors' apparatus), and then depositing zirconium from the deposition target 104 with $V_{BIAS}$ about −50 volts. The zirconium combines with the nitrogen to produce the ZrN coating in the layer 134. The second layer 134 is of a thickness such that the total thickness of the coating is from about 1½ to about 5 micrometers.

This pattern may be continued, depositing a third layer comprising Zr overlying the ZrN layer 134, then a fourth layer comprising ZrN overlying the third layer, and so on. In this case, the thicknesses of the individual layers are selected so that the total thickness of the coating is from about 1½ to about 5 micrometers. Various other compositions may be substituted for one or more of these layers, as well.

In another embodiment of a coating 130b, shown in FIG. 5B, the layers 132 and 134 are first deposited using the approach described above in relation to the coating 130a, with the layer 132 having a thickness of about 100–1000 Angstroms and the layer 134 having a thickness of about ¼ to about 1 micrometer. In this case, however, the deposited materials are titanium (Ti) and titanium nitride (TiN). A third layer 136 of titanium carbonitride (Ti(CN)) is deposited by backfilling the chamber with a small partial pressure of about 1–2 microns of a flowing carbon-containing gas such as acetylene (flowing at a rate of about 10–150 sccm in the inventor's apparatus) and also a partial pressure of about 3–4 microns of flowing nitrogen (flowing at a rate of about 100–300 sccm in the inventors' apparatus). The total pressure of the carbon-containing gas and nitrogen is about 5 microns. Titanium is deposited from the deposition target 104. The titanium reacts with the carbon from the carbon-containing gas and the nitrogen to deposit the titanium carbonitride third layer 136. A fourth layer 138 of TiN is deposited by repeating the steps used to deposit the second layer 134. The third layer and the fourth layer are preferably each from about ¼ to about 1 micrometer thick. Additional layers may be deposited in an alternating manner, if desired. The thicknesses of the individual layers are selected so that the total thickness of the coating is from about 1½ to about 5 micrometers.

In another embodiment of a coating 130c, shown in FIG. 5C, the layers 132 and 134 are first deposited as described for the coating 130a, in respective thicknesses of about 100–1000 Angstroms and about ¼ to about 1 micrometer. A third layer 140 of di-titanium nitride (Ti$_2$N) is deposited by backfilling the chamber with a small partial pressure of from about ¼ to about 3 microns of flowing nitrogen (flowing at about 20–300 sccm in the preferred apparatus), and then depositing titanium from the deposition target 104. The titanium reacts with the nitrogen to produce the third layer.

When a single metallic species is to be deposited into the coating 130, as in the embodiments of FIGS. 5A–5C, all of the deposition sources 70a, 70b, 70c, and 70d utilize deposition targets 104 made of that species. When two metallic species such as titanium and aluminum are to be deposited, some of the deposition sources utilize titanium deposition targets and some of the deposition sources utilize alloy deposition targets such as TiAl deposition targets. For example, the deposition sources 70a and 70c might be made with titanium deposition targets 104, and the deposition sources 70b and 70d might be made with titanium-aluminum deposition targets 104. All of the deposition sources would be operated during deposition of the titanium layer (with inert gas in the chamber), and only the deposition sources with TiAl targets would be used to deposit a (TiAl)N layer (with nitrogen gas in the chamber).

The use of various layers within the coating 130 yields results of two different types. First the mechanical and physical properties of the coating are varied according to the types, hardnesses, and thicknesses of the layers. Second, the color of the coating depends upon the layer which is exposed at the top of the coating. The color produced by this coating technique is long-lasting and will not readily spall or be worn away from the surface because of the hardness of the coating, a desirable feature because the surface of the implement 20 exhibits an attractive external appearance. For example, a ZrN top coating is champagne in color, a TiN top coating is golden yellow in color, a TiCN coating has a selectable color ranging from pink to grey depending upon the deposition parameters, a Ti$_2$N coating has a color like that of stainless steel, and a (TiAl)N coating is a lustrous gray color. Other coatings such as (TiAl)(CN) may be applied to vary the properties and color of the coating.

Figure 6:
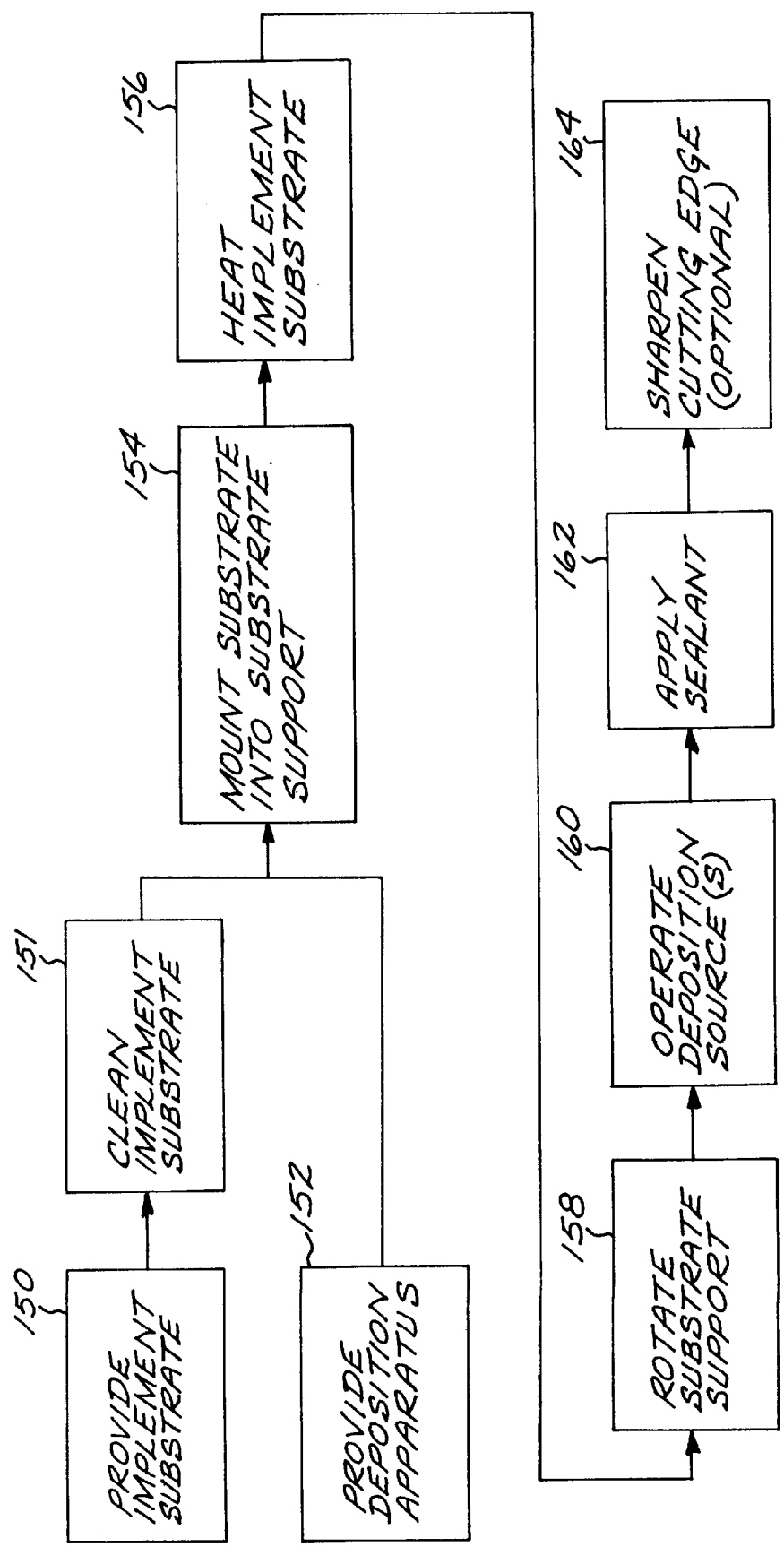
FIG. 6 is a block process flow diagram for a preferred method for preparing a manicure implement according to the invention.

FIG. 6 is a block flow diagram for a method of practicing the invention. A manicure implement substrate is provided, numeral 150. The manicure implement substrate is typically in the form of one of the implements 20. The manicure implement substrate is formed to the desired shape and heat treated in the conventional manner. The manicure implement substrate is carefully cleaned, numeral 151, in a strong aqueous alkaline soap solution to remove grease, dirt, native metal oxides, and other surface contaminants. The deposition apparatus is provided, numeral 152, preferably in the form described previously. The manicure implement substrate is mounted to the planetary carriage of the deposition apparatus, with the cutting edge of the substrate, if present, facing outwardly from the center of the planetary carriage, numeral 154. In a production operation, a plurality of manicure implement substrates are mounted to each planetary carriage.

The heater is activated to bring the manicure implement substrates to about the temperature of deposition, preferably about 600–900° F., numeral 156. As the deposition processing proceeds, the manicure implement substrates are also heated by the deposition operation, so that the power to the heater may be reduced somewhat. The feedback temperature controller 96 operates to maintain the temperature at a selected setpoint value. The rotation controller 88 is activated to rotate the rotational carriage at a rate of about 1 revolution per minute (rpm) and the planetary carriage at a rate of about 1½ rpm, numeral 158.

The deposition sources are operated to deposit the coating 130 onto the manicure implement substrates, numeral 160, while the heating step 156 and the rotational step 158 continue concurrently with the deposition. As discussed in relation to FIGS. 5, the operating conditions are selected to produce the desired layers within the coating. In a typical case, the current between the striker and the deposition target for each of the cathodic arc sources is 90–150 Amperes, $V_{BIAS}$ is in the range of −30 to −600 volts, and the backfill gas pressure of inert or reactive gas is about 2–6 microns, most preferably about 5 microns. Deposition is continued for a period sufficient to deposit from about 1½ to about 5 micrometers total thickness of material in the coating. By way of example of typical operating times, to produce the coating of FIG. 5A, the cathodic arc sources are operated for about 1–4 minutes with an argon backfill to produce the first layer 132 and then for about 90 minutes with a nitrogen backfill to produce the second layer 134. In these processes, $V_{BIAS}$ is desirably from about −400 to about −600 volts to deposit the first layer of zirconium or titanium, and thereafter $V_{BIAS}$ is reduced to about −30 to about −150 volts to deposit the remaining layers. The result is a strongly adherent coating.

The coated surface may contain some micropores in the coating. These micropores, if present, may lead to penetration of corrosive agents to the underlying substrate and to corrosion damage of that substrate. To seal the micropores, if present, against penetration of corrosive agents, the coated implement may be sealed by the application of a sealant, numeral 162. The sealant may be, for example, a solution of polytetrafluoroethylene, which penetrates into any micropores and is deposited therein. The deposited sealant lies below the top level of the wear-resistant coating, and accordingly is not worn away during use. The sealant prevents penetration of the corrosive agent through the micropores and to the underlying substrate.

The cutting edge 22, where present, is sharpened, numeral 164. Alternatively, the implements 20 having cutting edges may be supplied in a pre-sharpened form at step 150, and step 164 need not be performed.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method for preparing a manicure implement, comprising the steps of:

providing a manicure implement substrate;

coating at least a portion of the manicure implement substrate with a coating comprising a coating material including a chemical combination of a metal selected from the group consisting of vanadium, chromium, zirconium, niobium, molybdenum, hafnium, tantalum, and tungsten, and combinations thereof, and a nonmetal selected from the group consisting of nitrogen and carbon, and combinations thereof, wherein the step of coating includes the steps of depositing a metallic coating layer of the metal over at least a portion of the manicure implement substrate, and depositing the coating material overlying the metallic coating layer, the coating material comprising the same metal of the metallic coating layer, and the nonmetal.

2. The method of claim 1, wherein the step of coating includes the step of applying the coating to a thickness of from about 1½ to about 5 micrometers.

3. The method of claim 1, wherein the step of providing a manicure implement substrate includes the step of providing a manicure implement substrate selected from the group consisting of a nipper, a pusher, a rasp, a curette, and a file.

4. The method of claim 1, wherein the step of providing a manicure implement substrate includes the step of providing a manicure implement substrate having a sharpened blade edge region.

5. The method of claim 1, including an additional step, after the step of coating, of applying a sealant to an exposed surface of the it least one layer.

6. A manicure implement prepared by the method of claim 1.

7. A method for preparing a manicure implement, comprising the steps of:

providing a manicure implement substrate, wherein the step of providing includes the step of providing a manicure implement substrate having a substrate axis of elongation; and coating at least a portion of the manicure implement substrate with a coating comprising a coating material including a chemical combination of a metal selected from the group consisting of vanadium, chromium, zirconium, titanium, niobium, molybdenum, hafnium, tantalum, and tungsten, and combinations thereof, and a nonmetal selected from the group consisting of nitrogen and carbon, and combinations thereof, wherein the step of coating includes the step of providing a deposition apparatus comprising at least two linear deposition sources, each of the deposition sources lying parallel to a source axis and each of the deposition sources being a source of at least one of the metals, a source of at least one of the nonmetals reactive with the metal to produce a coating material, a substrate support adapted for rotational movement about the axis, and a substrate heater;

mounting the manicure implement substrate in the substrate support such that the substrate axis of elongation lies generally parallel to the source axis;

heating the manicure implement substrate to a substrate deposition temperature;

rotating the substrate support about the source axis; and operating the deposition sources to deposit the respective coating material onto the manicure implement substrate, the steps of heating, rotating, and operating to occur simultaneously.

8. The method of claim 7, wherein each of the deposition sources comprises a cathodic arc source.

9. The method of claim 7, wherein the step of providing a deposition apparatus includes the step of providing at least two deposition sources of a compound selected from the group consisting of titanium and zirconium.

10. The method of claim 1, wherein the step of coating includes the step of applying a coating comprising zirconium nitride.

11. A manicure implement, comprising:

a manicure implement substrate made of a substrate material having a surface, the manicure implement substrate being selected from the group consisting of a nipper, a pusher, a rasp, a curette, and a file; and a corrosion-resistant coating overlying and contacting at least a portion of the surface of the manicure implement substrate, the corrosion-resistant coating comprising a coating material selected from the group consisting of a metal and a ceramic, wherein the coating comprises a first layer comprising a metal, and
a second layer of the coating material formed of a chemical combination of the metal of the first layer and at least one other element, the second layer overlying and contacting the first layer.

12. The manicure implement of claim 11, wherein the coating material comprises a chemical combination of a metal selected from the group consisting of vanadium, chromium, zirconium, titanium, niobium, molybdenum, hafnium, tantalum, and tungsten, and combinations thereof, and a nonmetal selected from the group consisting of nitrogen and carbon, and combinations thereof.

13. The manicure implement of claim 11, wherein the coating material includes at least one compound selected from the group consisting of zirconium nitride, titanium nitride, di-titanium nitride, titanium aluminum nitride, titanium carbonitride, and titanium aluminum carbonitride.

14. The manicure implement of claim 11, wherein the coating material comprises zirconium nitride.

15. The manicure implement of claim 11, wherein the corrosion-resistant coating has a thickness of from about 1½ to about 5 micrometers.

16. The manicure implement of claim 11, wherein the substrate material is stainless steel.

17. The manicure implement of claim 11, further including a sealant overlying the coating.

18. The manicure implement of claim 11, wherein the coating material comprises a chemical combination of titanium and a nonmetal selected from the group consisting of nitrogen and carbon, and combinations thereof.

* * * * *